(12) United States Patent
Klotz et al.

(10) Patent No.: US 6,388,344 B1
(45) Date of Patent: May 14, 2002

(54) POWER SEMICONDUCTOR ARRAY ON A DCB SUBSTRATE

(75) Inventors: Frank Klotz, München; Leo Lorenz, Neubiberg, both of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/467,350

(22) Filed: Dec. 20, 1999

Related U.S. Application Data

(63) Continuation of application No. PCT/DE98/01252, filed on May 5, 1998.

(51) Int. Cl.$^7$ ............................................... H01H 19/64
(52) U.S. Cl. ........................ 307/113; 307/115; 257/691
(58) Field of Search ........................... 307/85, 109, 115, 307/113; 257/753, 783, 784, 207, 500, 502, 723, 724, 762, 691

(56) References Cited

U.S. PATENT DOCUMENTS

| | | | | |
|---|---|---|---|---|
| 4,819,042 A | * | 4/1989 | Kaufman | 357/80 |
| 5,444,295 A | * | 8/1995 | Lake et al. | 257/678 |
| 5,492,842 A | * | 2/1996 | Eytcheson et al. | 29/593 |
| 5,512,790 A | * | 4/1996 | Lachenmaier et al. | 307/112 |
| 5,523,620 A | * | 6/1996 | Eytcheson et al. | 257/341 |
| 5,539,254 A | * | 7/1996 | Eytcheson et al. | 257/691 |
| 5,563,447 A | * | 10/1996 | Lake et al. | 257/724 |
| 5,623,399 A | | 4/1997 | Ishii et al. | |
| 5,895,974 A | * | 4/1999 | Eytcheson et al. | 257/107 |
| 5,982,031 A | * | 11/1999 | Stockmeier | 257/500 |
| 6,127,727 A | * | 10/2000 | Eytcheson | 257/692 |
| 6,324,072 B1 | * | 11/2001 | Lorenz et al. | 257/723 |

FOREIGN PATENT DOCUMENTS

| | | |
|---|---|---|
| DE | 40 34 674 C2 | 8/1991 |
| DE | 42 22 785 C2 | 1/1993 |
| EP | 0 645 815 A2 | 3/1995 |

* cited by examiner

*Primary Examiner*—Josie Ballato
*Assistant Examiner*—Sharon Polk
(74) *Attorney, Agent, or Firm*—Laurence A. Greenberg; Werner H. Stemer; Gregory L. Mayback

(57) ABSTRACT

A power semiconductor array on a direct copper bonding (DCB) semiconductor substrate is created, in which the interference emissions propagated via its terminal lines are eliminated, or at least greatly reduced, directly on the semiconductor device. The power semiconductor array on the DCB substrate includes a first intermediate circuit terminal connected to a positive potential, a second intermediate circuit terminal connected to a negative potential, and at least one load terminal. The power semiconductor array further includes at least two power switches for connecting the load terminal to the first and second intermediate circuit terminals in alternation. The power semiconductor array is characterized by bridging connections that connect at least some of the terminals of the power semiconductor array that lead to the outside to one another in pairs, so that interference circuits within the power semiconductor array are closed.

11 Claims, 3 Drawing Sheets

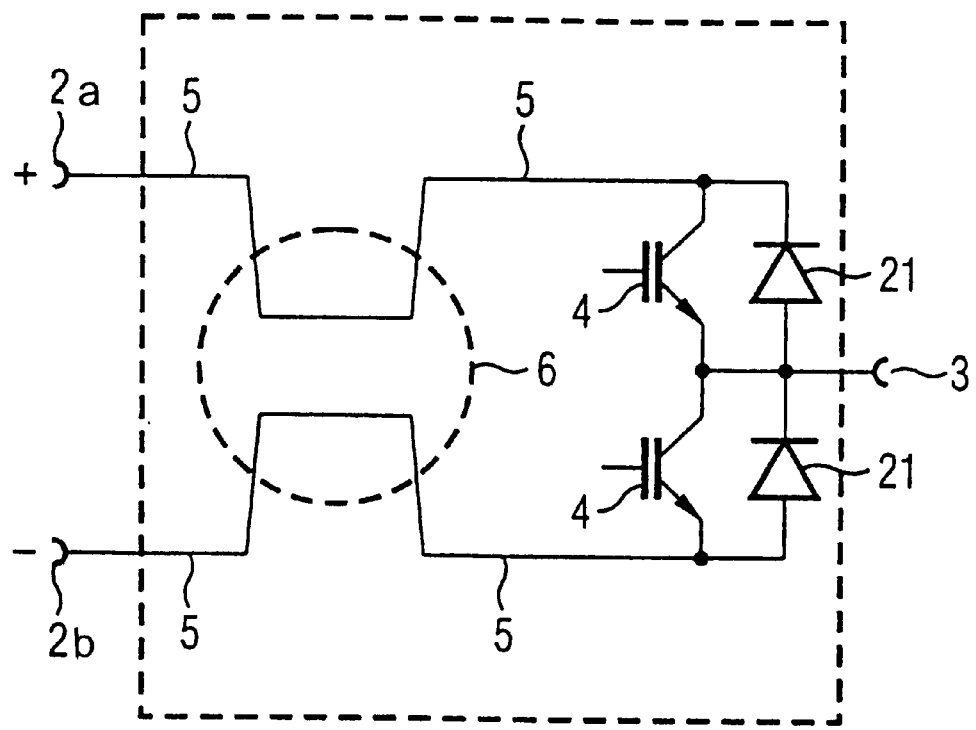
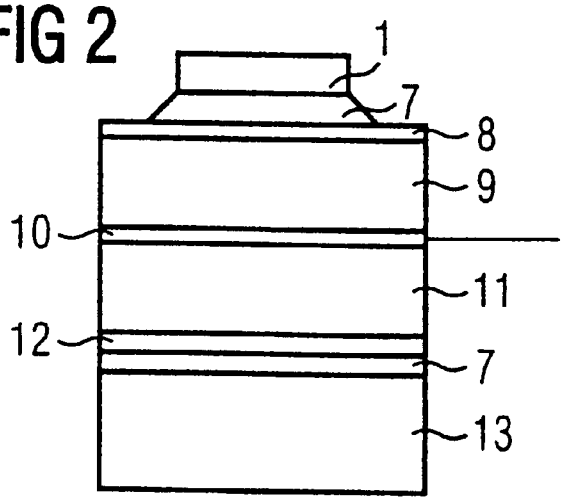

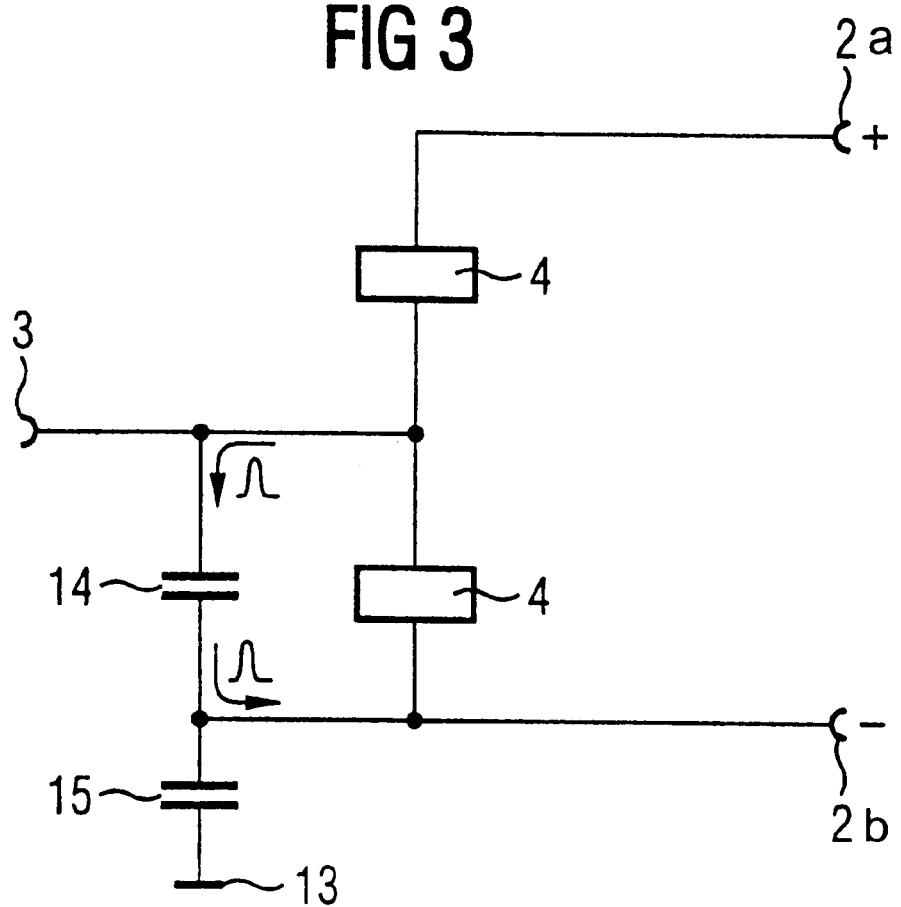

POWER SEMICONDUCTOR ARRAY ON A DCB SUBSTRATE

CROSS-REFERENCE TO RELATED APPLICATION

This is a continuation of copending International Application PCT/DE98/01252, filed May 5, 1998, which designated the United States.

BACKGROUND OF THE INVENTION

FIELD OF THE INVENTION

The invention relates to a power semiconductor array on a direct copper bonding (DCB) substrate which includes a first intermediate circuit terminal connected to a positive potential, a second intermediate circuit terminal connected to a negative potential, and at least one load terminal. The power semiconductor array further has at least two power switches for connecting the load terminal to the first and second intermediate circuit terminals in alternation. Such power semiconductor arrays serve as a power part for contactless energy conversion to suit a target function, for instance in drive power converters with rpm governing, interrupt-free power supplies, in electroplating and for use in welding current courses, and so forth. To that end, energy is drawn from the supply terminals (intermediate circuit terminals) of the power semiconductor arrays to suit the desired power flow and is supplied to the applicable load, and then fed back from the load to the intermediate circuit. Thus the intermediate circuit is a buffer store for energy, for instance in the form of a capacitor battery. The invention is especially well suited to such an application, but is not limited to it.

In the prior art, the actual semiconductor chip in the power semiconductor array is joined via solder to a first copper layer, which is mounted in turn on a ceramic insulator. The ceramic insulator is joined to the bottom plate of the structure via a second copper layer and solder. The bottom plate serves to mount the array mechanically on a cooling body and for touch protection is usually resting on ground (protective ground).

Power electronic circuits of this kind, which operate on the basis of fast switching events on the principle of energy conversion through switching, cause a high degree of electromagnetic interference emission. The limits of maximum interference emission prescribed in some standards (such as 50081/1/2) are then far exceeded and require major expenditure for interference suppression. When the power semiconductor array of the prior art is used, among other provisions, expensive external circuits are therefore required, which filter out the interference currents or voltages that are caused by the fast switching.

SUMMARY OF THE INVENTION

It is accordingly an object of the invention to provide a power semiconductor array on a DCB substrate that overcomes the above-mentioned disadvantages of the prior art devices of this general type, in which the interference emissions propagated over its terminal lines are eliminated, or at least sharply reduced, directly on the semiconductor device.

With the foregoing and other objects in view there is provided, in accordance with the invention, a power semiconductor array on a direct copper bonding substrate, including:

terminals including a first intermediate circuit terminal to be connected to a positive potential, a second intermediate circuit terminal to be connected to a negative potential, at least one load terminal, and a ground terminal;

at least two power switches, including a first power switch and a second power switch, connecting the at least one load terminal to the first and second intermediate circuit terminals in alternation;

an insulation layer having a conductive intermediate layer disposed therein;

connections that capacitively connect at least some of the terminals that lead to an outside to one another in pairs, and the ground terminal leading to the outside is capacitively connected to the at least one load terminal via the insulation layer, and the conductive intermediate layer connected to one of the first and second intermediate circuit terminals.

The principle on which the invention is based is thus to reduce the interference by short-circuiting parasitic interference current paths within the power semiconductor array.

In a preferred embodiment of the power semiconductor array, a connecting line between the first intermediate circuit terminal and the first power switch and a connecting line between the second intermediate circuit terminal and the second power switch are disposed such that the two intermediate circuit terminals are capacitively connected to one another.

A ground terminal leading to the outside can also be provided; the load terminal is capacitively connected to the ground terminal via an insulation layer, and the insulation layer has a conductive intermediate layer that is connected to the first or second intermediate circuit terminal. The intermediate layer preferably is formed of copper or a copper alloy.

The power semiconductor array of the invention can also have a driver stage for triggering the power switches with two driver supply terminals, and the driver supply terminals are connected capacitively and/or galvanically with at least one of the intermediate circuit terminals. (The term "galvanic bonding" is understood hereinafter to be a direct electrical connection, with negligibly slight or finite ohmic resistance, in contrast to a capacitive or inductive connection.) In addition to a capacitive coupling, the driver supply terminals of the driver stage can be inductively coupled to one another.

The power switches of the power semiconductor array can be active or passive power switches. The power switches can also each include a plurality of power switch elements, to increase the total attainable switching capacity. The individual active power switch elements can additionally include reverse diodes connected parallel to the switching path.

Other features which are considered as characteristic for the invention are set forth in the appended claims.

Although the invention is illustrated and described herein as embodied in a power semiconductor array on a DCB substrate, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a circuit diagram of one embodiment of a semiconductor array with two power switches according to the invention;

FIG. 2 is a sectional view of another embodiment of the semiconductor array;

FIG. 3 is a circuit diagram of the semiconductor array of FIG. 2;

DESCRIPTION OF THE PREFERRED EMBODIMENTS

Figure 4:
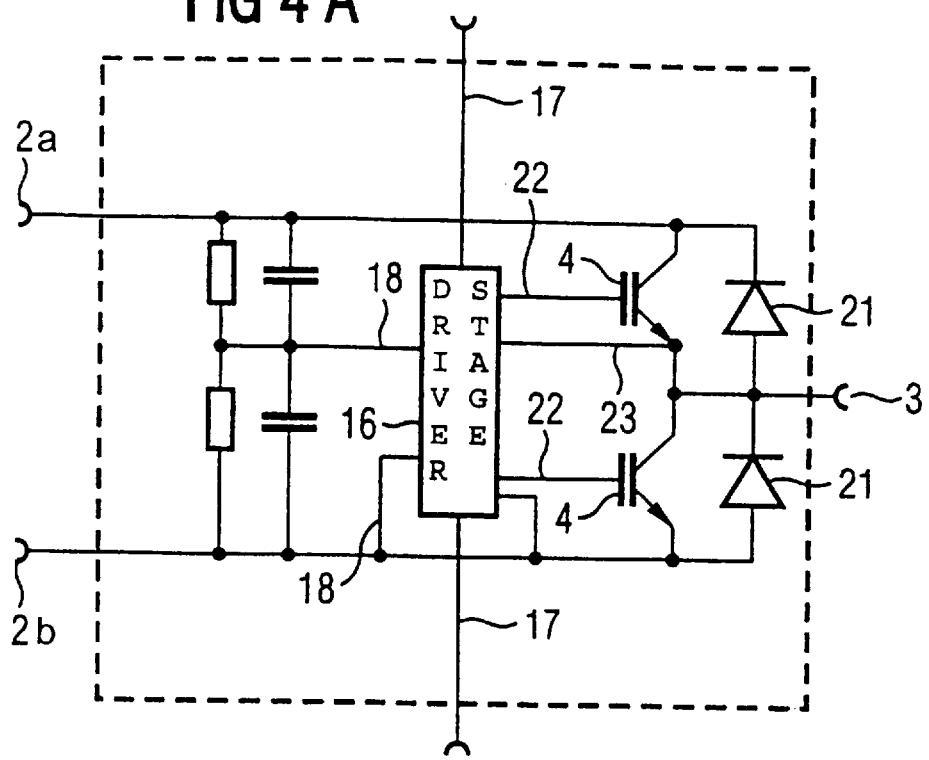
FIG. 4a is a circuit diagram of the semiconductor array with a driver stage.
FIG. 4b is a circuit diagram of a further embodiment of the semiconductor array with the driver stage.
Figure 4:
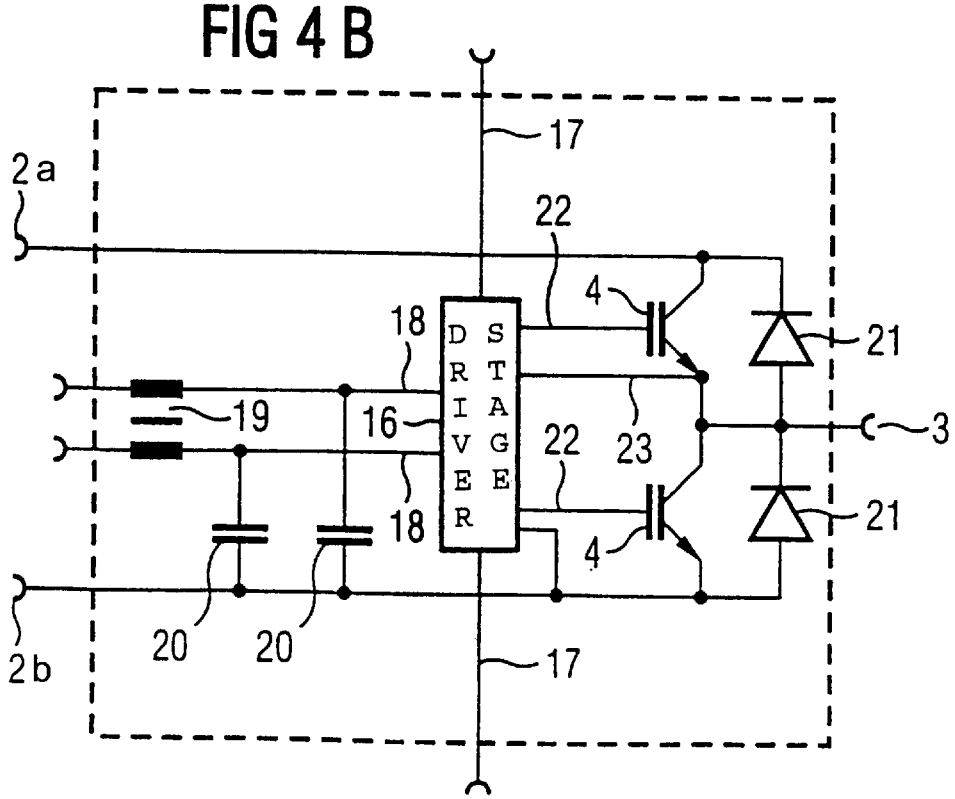

In all the figures of the drawing, sub-features and integral parts that correspond to one another bear the same reference symbol in each case. Referring now to the FIGS. of the drawing in detail and first, particularly, to FIG. 1 thereof, there is shown a semiconductor array that is disposed on a DCB substrate and essentially includes two active power switches 4 and two parallel-connected reverse diodes 21. The reverse diodes 21 are each connected on one side to one intermediate circuit terminal 2a or 2b via connecting lines 5. On their other side, they are connected both to one another and to a load terminal 3. Upon triggering via their gate terminal, the connection between the load terminal 3 and one of the intermediate circuit terminals 2a or 2b is essentially short-circuited by the power switches 4, thus connecting the load terminal 3 to a desired potential.

If the potential to which the load terminal 3 is connected changes rapidly, the switching engenders high-frequency interferences. The so-called symmetrical interference is transmitted via the intermediate circuit terminals 2a, 2b from the semiconductor array to the intermediate circuit (not shown) and from there into the terminal network, which it leads to undesired interference effects.

According to the invention, to suppress the transmission of the symmetrical interference emissions to the outside, a capacitive coupling 6 of the two lines 5 is brought about by a special configuration of the connecting lines 5 in the semiconductor array and by a low-inductance capacitor. By use of the capacitor, high-frequency currents that originate in the power switches 4 are short-circuited inside the semiconductor array and thus do not reach the outside.

Further suitable provisions regarding the connecting lines 5 can also be made, so as to define the size of the capacitive coupling 6.

In a further embodiment of the semiconductor array of the invention, a different interference current path is closed internally in the array. This embodiment is shown in cross section in FIG. 2. The semiconductor substrate 1 is disposed via a solder layer 7 and a first copper layer 8 on a first insulation layer 9. This layer structure is known generally as direct copper bonding (DCB). In the prior art (not shown), a second copper layer adjoins the underside of the insulation layer and is connected in turn, via a solder layer 7, to a bottom plate 13, which supports the entire structure. As a protective provision, the bottom plate 13 is connected to ground. The insulation layer may be a nitrite, BeO, AlNi, diamond, or the like.

When the power switches 4 on the semiconductor substrate 1 switch, however, the charging and discharging of the capacitor formed by the semiconductor substrate 1—bottom plate 13 array causes so-called asymmetrical interference.

The asymmetrical interference occurs because when rapid voltage changes occur, parasitic capacitances are charged and discharged. The interference is therefore propagated via terminal lines and ground terminals.

According to the invention, to suppress the transmission of the asymmetrical interference emissions to the outside, the insulation layer is divided into a first insulation layer 9 and a second insulation layer 11 by a conductive intermediate layer 10 located between them. This creates an intermediate tap "in" of the capacitor made up of the substrate 1 and bottom plate 13. The intermediate tap is connected according to the invention to one of the intermediate circuit terminals 2a, 2b. As a result, high-frequency currents that originate at the power switches 4 and that would flow out capacitively to ground via the bottom plate 13 are short-circuited within the semiconductor array and thus do not reach the outside. No potential fluctuations are transmitted to the ground terminal.

An electrical circuit diagram of the structure in FIG. 2 is shown in FIG. 3. As already described for FIG. 1, the two switches 4 each short-circuit the load terminal 3 to a respective one of the intermediate circuit terminals 2a or 2b, depending on the desired potential of the load terminal 3. The semiconductor substrate 1 and thus the load terminal 3 is capacitively coupled to the bottom plate 13 and thus to ground, via the above-described layered structure of the semiconductor array. The capacitor is divided into two partial capacitors 14 and 15. The first partial capacitor 14 is followed by a tap, which is applied to a direct voltage potential; in the instance shown here, the tap is connected, along with the intermediate circuit terminal, to the negative potential. Finally, the second partial capacitor 15 couples the structure capacitively to ground. Physically, the partial capacitors 14 and 15 are made up of the first copper layer 8, the first intermediate layer 9 and the conductive intermediate layer 10, on the one hand, and the intermediate layer 10, the second intermediate layer 11 and the second copper layer 12, on the other.

The asymmetrical interference current, which is generated from the semiconductor substrate 1 outward, is thus quasi-diverted before reaching ground and is delivered instead to an intermediate circuit terminal, and as a result the interference current path is closed inside the structure.

The asymmetrical interference can also propagate not only via ground and the supply terminals (to the intermediate circuit terminal) but also via other terminals of the semiconductor array. This is the case particularly if the switches 4 are triggered via a common driver stage, or if each of them is triggered via its own integrated driver stage. One such circuit is shown in FIGS. 4a and 4b.

In addition to the elements known from FIG. 1, the structure of the power semiconductor array of FIGS. 4a and 4b has a driver stage 16, which is connected at least to the gate-to-source and emitter-to-source terminals of the power switches 4 and which has two triggering terminals 17. In the embodiment of FIG. 4a, for power supply purposes, the driver stage 16 is provided with driver supply terminals 18, which are connected to the intermediate circuit terminals 2a, 2b. In this embodiment, the tap is effected via capacitors and resistors on the one hand and via a direct connection to the intermediate circuit terminal 2b on the other.

In the embodiment of the semiconductor array shown in FIG. 4b, the supply is effected from the outside. In this case, the external terminals are capacitively connected to an intermediate circuit terminal 2b via filter capacitors 20. As a result, once again current paths for high-frequency interference currents are closed inside the module, or in other words inside the power semiconductor array of the invention.

To attain further shielding with regard to high-frequency interference to the outside, in the embodiment of FIG. 4b the two driver supply terminals 18 are also inductively coupled with one another 19.

In both embodiments of the semiconductor array shown in FIG. 4a and FIG. 4b, the driver stages 16 are configured in free-floating fashion, and they generate a gate-to-source/emitter voltage between a gate terminal 22 and a source-to-emitter terminal 23 with an absolute value of approximately 15 V, and at most 20 V. The potential of the load terminal, however, can be at 700 V, for example, compared to ground. The switches 4 in the embodiments described above can be active switches, such as IGBTs, power MOSFETs, bipolar transistors, thyristors, GTO thyristors, etc., or they can be passive switches, such as diodes. The power switches 4 can contain a plurality of individual switching elements connected in series or parallel between the intermediate circuit terminals 2a, 2b and the load terminal 3. Furthermore, as shown in FIGS. 4a and 4b, the active switching elements can have the reverse diodes 21.

In the dimensioning of the capacitive and inductive magnitudes in the semiconductor array of the invention, reference can be made to external values for the load; that is, the semiconductor array of the invention can be configured for special ohmic, inductive or capacitive load values.

To reduce heat resistance that may possibly have arisen from the subdivision of the insulation layer in the embodiment of FIG. 2, additional heat-dissipating elements can also be provided in the semiconductor array.

We claim:

1. A power semiconductor array, comprising:
    terminals including a first intermediate circuit terminal to be connected to a positive potential, a second intermediate circuit terminal to be connected to a negative potential, at least one load terminal, and a ground terminal;
    at least two power switches, including a first power switch and a second power switch, connecting said at least one load terminal to said first and second intermediate circuit terminals in alternation; and
    a direct copper bonding substrate having said at least two power transistors disposed thereon, said direct copper bonding substrate including an insulation layer having a first insulation layer, a second insulation layer, and a conductive intermediate layer disposed between said first insulation layer and said second insulation layer, said conductive intermediate layer connected to one of said first and second intermediate circuit terminals to capacitively connect one of said first and second intermediate circuit terminals to said at least two power switches.

2. The power semiconductor array according to claim 1, including a first connecting line disposed between said first intermediate circuit terminal and said first power switch, and
    a second connecting line disposed between said second intermediate circuit terminal and said second power switch,
    said first connecting line and said second connecting line disposed such that said first and second intermediate circuit terminals are capacitively connected to one another.

3. The power semiconductor array according to claim 1, wherein said conductive intermediate layer is formed of a material selected from the group consisting of copper and copper alloy.

4. The power semiconductor array according to claim 1, including a driver stage for triggering said at least two power switches, said driver stage having two driver supply terminals connected at least one of capacitively and
    galvanically with at least one of said first and second intermediate circuit terminals.

5. The power semiconductor array according to claim 4, wherein said two driver supply terminals of said driver stage are inductively coupled to one another.

6. The power semiconductor array according to claim 1, wherein said at least two power switches include insulated gate bipolar transistors (IGBTs).

7. The power semiconductor array according to claim 1, wherein said at least two power switches include metal-oxide-semiconductor field-effect transistors (MOSFETs).

8. The power semiconductor array according to claim 6, wherein said at least two power switches define a switching path, and including reverse diodes disposed parallel to said switching path.

9. The power semiconductor array according to claim 7, wherein said at least two power switches define a switching path, and including reverse diodes disposed parallel to said switching path.

10. The power semiconductor array according to claim 1, wherein said at least two power switches each include a plurality of operatively series-connected power switch elements.

11. The power semiconductor array according to claim 1, wherein said at least two power switches each include a plurality of operatively parallel-connected power switch elements.

* * * * *

UNITED STATES PATENT AND TRADEMARK OFFICE
CERTIFICATE OF CORRECTION

PATENT NO.    : 6,388,344 B1
DATED         : June 14, 2002
INVENTOR(S)   : Frank Klotz et al.

It is certified that error appears in the above-identified patent and that said Letters Patent is hereby corrected as shown below:

<u>Title page,</u>
Item [30] should read as follows:

-- June 18, 1997    [DE] …………………... 197 25 836.0 --

Signed and Sealed this

First Day of October, 2002

Attest:

JAMES E. ROGAN
Attesting Officer
Director of the United States Patent and Trademark Office